United States Patent [19]

Coffman et al.

[11] Patent Number: 5,007,968

[45] Date of Patent: Apr. 16, 1991

[54] PROCESS AND APPARATUS FOR TREATING ARTICLES OF SUBSTANTIAL THICKNESS

[75] Inventors: Frederick E. Coffman; Charles H. Pelton, both of State College, Pa.

[73] Assignee: Chemcut Corporation, State College, Pa.

[21] Appl. No.: 387,333

[22] Filed: Jul. 28, 1989

[51] Int. Cl.$^5$ .............................. B08B 9/20; B08B 3/00
[52] U.S. Cl. .................................... 134/25.4; 134/15; 134/18; 134/24; 134/25.1; 134/32; 134/94; 134/64 R; 134/104.2; 134/122 R; 134/198; 156/664; 156/666
[58] Field of Search ........................ 134/24, 32, 18, 15, 134/64 R, 94, 104.2, 122 R, 198, 25.1, 25.4

[56] References Cited

U.S. PATENT DOCUMENTS

| | | | |
|---|---|---|---|
| 3,448,720 | 6/1969 | Graham | 118/109 |
| 4,015,706 | 4/1977 | Goffredo et al. | 198/730 |
| 4,046,248 | 9/1977 | Goffredo et al. | 198/583 |
| 4,064,019 | 12/1977 | Eidschun Jr. | 204/15 |
| 4,402,800 | 9/1983 | Ash et al. | 204/15 |
| 4,453,916 | 6/1984 | Osipov et al. | 432/197 |
| 4,459,183 | 7/1984 | Brady et al. | 204/27 |
| 4,650,542 | 3/1987 | Ash | 156/640 |

Primary Examiner—Curtis R. Davis
Attorney, Agent, or Firm—Paul & Paul

[57] ABSTRACT

A method and apparatus is provided for chemically treating articles, often with a liquid treatment fluid that is corrosive, while the articles are being delivered along a path through a substantially closed chamber. During treatment, the articles pass through a nip formed between opposed rollers, at least one of which is rotatably driven. Because of the thickness of the articles, at least one roller of the nip must be moved away from the other roller in order for articles to pass through the nip. The roller being moved remains positively driven as it moves away from the nip and remains driven until the nip is again closed, all without interferring with the drive.

19 Claims, 4 Drawing Sheets

PROCESS AND APPARATUS FOR TREATING ARTICLES OF SUBSTANTIAL THICKNESS

BACKGROUND OF THE INVENTION

In the manufacture of printed circuit boards, printed circuit elements and like goods, and in processes connected with the same, it has become commonplace to deliver the articles, such as printed circuit boards, printed circuit film or the like, through a chamber in a continuous manner, while the articles are being treated by the spray of a suitable treatment fluid, such as an etchant, onto them. Often the etchant is of a corrosive nature, but on other occasions it can be various chemical solutions or even ordinary rinsing liquid, such as water. See, for example, U.S. Pat. No. 4,233,106, the disclosure of which is herein incorporated by reference.

Especially in instances when the treatment fluids are liquids that are corrosive in nature, it is undesirable to have the liquids pass outwardly of the treatment chamber, because if they did, they would require earlier replenishment than would be desirable, or would require special handling of the treatment liquid that passes outwardly of the chamber. Even further, considerations of costs are involved, in connection with loss of treatment fluid.

In the course of preventing the passage of treatment fluid outwardly of treatment chambers, it has become commonplace to locate a pair of opposed rollers, at least near the exit of the treatment chamber, although in many instances opposed pairs of rollers are located at both the inlet and exit of the treatment chamber, preventing the undesirable passage of treatment liquid out an associated opening of the chamber. In even other instances, opposed roller pairs are provided at various locations throughout the treatment chamber, not related to an opening.

In any event, opposed roller pairs are utilized in treatment chambers to prevent passage of liquid out openings, or to provide a driving means for driving the articles that are treated along their predetermined path through the chamber, generally from inlet to exit, or to both drive the articles and prevent liquid passage.

In the course of known processes, it has been commonplace for rollers to provide a nip between them for squeezing the articles as they pass through the nip, to facilitate removal of the treatment liquid from surfaces of the articles as they pass through the nip. Such rollers are generally referred to as anti-dragout rollers, because they cooperate to prevent the dragging-out of treatment liquid from the chamber at the exit end.

It will be understood that similar, although perhaps less pronounced problems can exist at the inlet end of the chamber, so that similar rollers are often used thereat.

With increased miniaturization in many industries, including the electronics industry, printed circuit articles have become thinner, lending themselves to multilayer construction. In fact, in many instances printed circuit boards, particularly those of multi-layer types, have many layers and have thus become substantially thicker than boards as used in the past. Increased thickness also accurs with other thick articles treated with other treatment fluids, not involved with the printed circuit industry.

As articles being treated become increasingly thicker, upon their passing through a nip of opposed rollers, the nip needs to adjust to permit the articles therethrough. In the past, the upper roller of a nip pair of rollers would have its shaft slot-mounted at its ends, allowing the upper roller, by its weight, to press on the upper surface of a board being treated, while the upper roller moved upwardly, as guided by roller shaft ends sliding upwardly in slotted holes in sidewalls of the equipment. But, because the rollers are generally driven to press against the article surfaces preferably while driving the articles longitudinally of the apparatus, the limit of upward movement of a roller being lifted was determined by whatever looseness or "play" existed in the drive for the roller, or else the roller was lifted so much that its driven end became disengaged from its drive, thereby sometimes interrupting the continuous operation of a continuous process.

The present invention is directed toward effecting the treatment of articles as described above, in such a way that as articles pass through the nip of an opposed pair of rollers, they cause one of the rollers to move away (preferably an upper roller moving upwardly) from the path of travel of articles being treated, in separation of the roller nip, while that moved roller remains driven, even when an article being treated is of substantial thickness. When the articles passes the nip, the roller returns automatically to its opposed roller to close the nip, all the while being driven.

SUMMARY OF THE INVENTION

The present invention is therefore directed toward providing a process and apparatus in which, as articles are delivered along their predetermined path through a zone in which they are being treated by a treatment liquid, they can be engaged by opposed rollers, pass between the nip formed between opposed rollers, irrespective of the thickness of articles, with the opposed rollers all the while remaining driven.

Accordingly, it is a primary object of this invention to provide a method and apparatus for treating articles that are sufficiently thick that they require separation of at least one of the rollers of the nip, away from the other roller of the nip, without adversely interfering with the continuous drive of the roller being separated from the nip.

It is a further object of this invention to accomplish the above object by physically accommodating the movement of a roller being lifted from the nip as an article being treated passes through the nip, while positively driving the roller being lifted.

It is yet another object of the present invention to accomplish the above objects, wherein the roller being lifted remains gear-driven.

It is a further object of this invention to accomplish the above objects, wherein the movement of the driven roller to open the nip is effected by pivotally mounting the roller.

Other objects and advantages of the present invention will be readily apparent to those skilled in the art, from a reading of the following brief descriptions of the drawing figures, detailed description of the preferred embodiment, and the appended claims.

DETAILED DESCRIPTION OF THE PREFERRED EMBODIMENT

Figure 1:
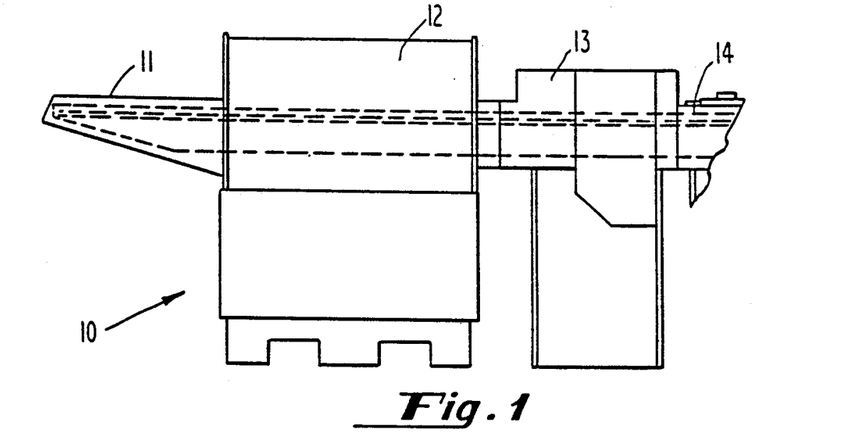
FIG. 1 is a fragmentary vertical elevational view, of an assembly line for continuously treating articles as part of a chemical treatment operation, wherein various treatment fluids may be applied to the articles as they travel along a predetermined path.

Referring now to the drawings in detail, reference is first made to FIG. 1, wherein there is illustrated a continuous treatment system generally designated by the number 10, as including an inlet unit 11, and etching unit 12, a rinsing unit 13, and another treatment unit or station 14 that may comprise additional rinsing, drying, etc., as desired It will be understood that the system 10 of FIG. 1 is illustrative only, and that such systems can include may different units, modules, or stations.

Generally, the units 11 through 14 will be commonly driven by means of a drive mechanism similar to that set forth in U.S. Pat. No. 4,015,706, the disclosure of which is herein incorporated by reference.

Figure 2:
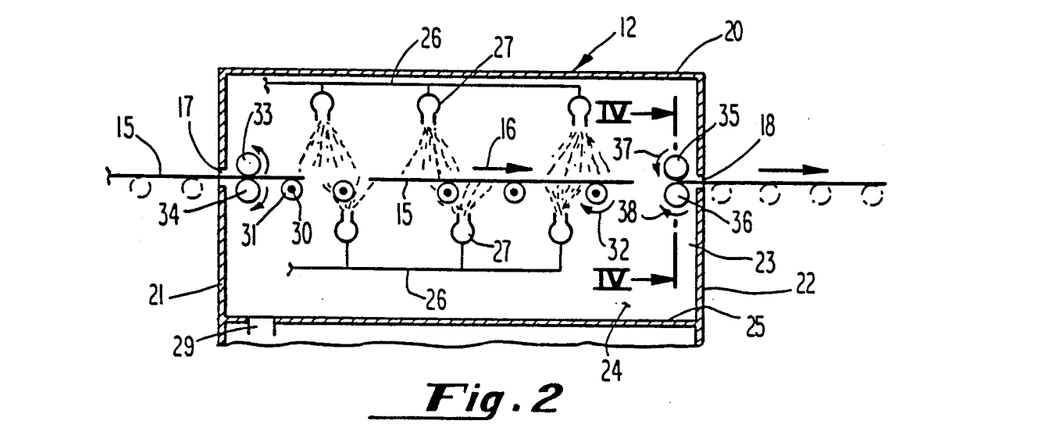
FIG. 2 is a fragmentary vertical sectional schematic view of a portion of a treatment chamber, in which articles have treatment fluid applied thereto as they travel along a predetermined path between inlet and exit openings thereof, with roller pairs having nips therebetween being illustrated at inlet and exit openings thereof and with the drive mechanisms for rollers that are driven being omitted for the sake of clarity.

With particular reference to FIG. 2, it will be seen that the articles 15 being treated in the chamber 12 pass from left to right therethrough in the direction of the arrows 16 of FIG. 2, from an inlet opening 17 to an exit opening 18, as they pass along their path of travel represented by a straight line between said openings.

The chamber 12 is provided with a top wall 20, left and right end walls 21 and 22, respectively, a pair of opposed sidewalls such as 23, spaced apart transversely of the apparatus. The treatment zone 24 at the upper end of the apparatus 12 fragmentally illustrated in FIG. 2 is provided with a bottom wall 25 having a liquid discharge line 29 for removal of liquid from zone 24.

In the treatment station 12 illustrated in FIG. 2, a treatment fluid of the liquid type is delivered from an appropriate source, such as the bottom of the unit 12 (not shown), through delivery lines 26, to appropriate liquid outlets, such as those of the flood bar type 27 illustrated in FIG. 2, from which the etchant or other treatment liquid is dispensed, as shown. Such liquid may be dispensed from above, or from below the path of travel that is defined by a straight line between inlet 17 and exit 18, or may be selectively dispensed from one or more flood bars 27, or any alternative nozzles or the like, as are desired. The treatment liquid may, if desired be delivered in accordance with U.S. Pat. No. 4,650,542, the complete disclosure of which is also herein incorporated by reference. Also, it will be understood that the drive mechanism mentioned above, such as that set forth in U.S. Pat. No. 4,015,706, or any similar drive mechanism may be employed to drive rods 30 having wheels 31 thereon in a clockwise direction such as that designated by the 32 of FIG. 2, such that articles 15 are driven in the direction of the arrow 16.

Similarly, the above-described drive mechanism may drive opposed pairs of roller 33, 34 and 35, 36, located respectively at inlet and exit openings 17 and 18. Opposed roller pairs will be driven with the rollers of each pair rotating in opposite directions, as shown by the arrows 37 and 38 of FIG. 2, in the preferred embodiment. In such an embodiment, at least one roller of a pair provides a driving function to the articles being delivered their predetermined path 16.

While not shown in FIG. 2, it is also within the purview of the present invention that opposed roller pairs could be at any location between the inlet and outlet openings 17 and 18, and at least one roller in each pair would be a driven roller as well.

Figure 3:
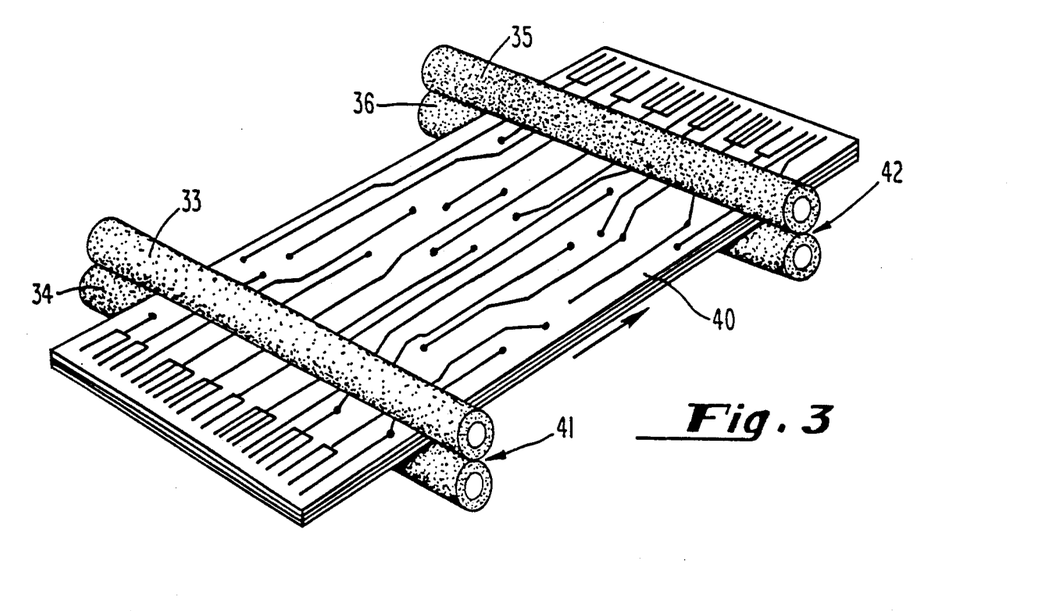
FIG. 3 is an enlarged schematic perspective illustration of inlet and exit roller pairs having nips formed therebetween, in engagement with a printed circuit board or article, in accordance with this invention.

With particular reference to FIG. 3, the opposed roller pairs 33, 34 and 35, 36, are illustrative in perspective, and in the embodiment of FIG. 3, are shown to be delivering therebetween a thick, multilayer printed circuit article 40. While, as with the illustrations of FIGS. 1 and 2, the drive mechanism for driving the rollers 33–36 is not shown, it will be understood that such will preferably be as referenced in the above-mentioned issued patents.

Roller pair 33, 34 is provided with a nip 41 formed at the location where the opposed rollers meet. Similarly a nip 42 is provided between pair 35, 36.

If will further be understood that the opposed roller of any given pair can have surfaces that are resilient, such that the rollers will be in pressed-together engagement with each other when no article is passing therebetween, and when an article such as that 40 or 15 is passing therebetween, the surfaces of the rollers may resiliently deflect, or deform somewhat. This may be accomplished by using rollers of an elastomeric or felt-like material, as desired, selected to be suitable in accordance with the conditions imposed by the treatment liquid, such as to resist corrosion or the like. Thus, opposed rollers of any given pair are somewhat "squeezed" together in their normal mounting operation, and when an article passes through the nip formed between such rollers, they will, in turn, squeeze the article, and thereby wipe substantial amounts of the treatment liquid from the surfaces thereof. Such materials of construction of the surfaces of rollers is within the scope of the prior art and need not be repeated here.

Figure 4:
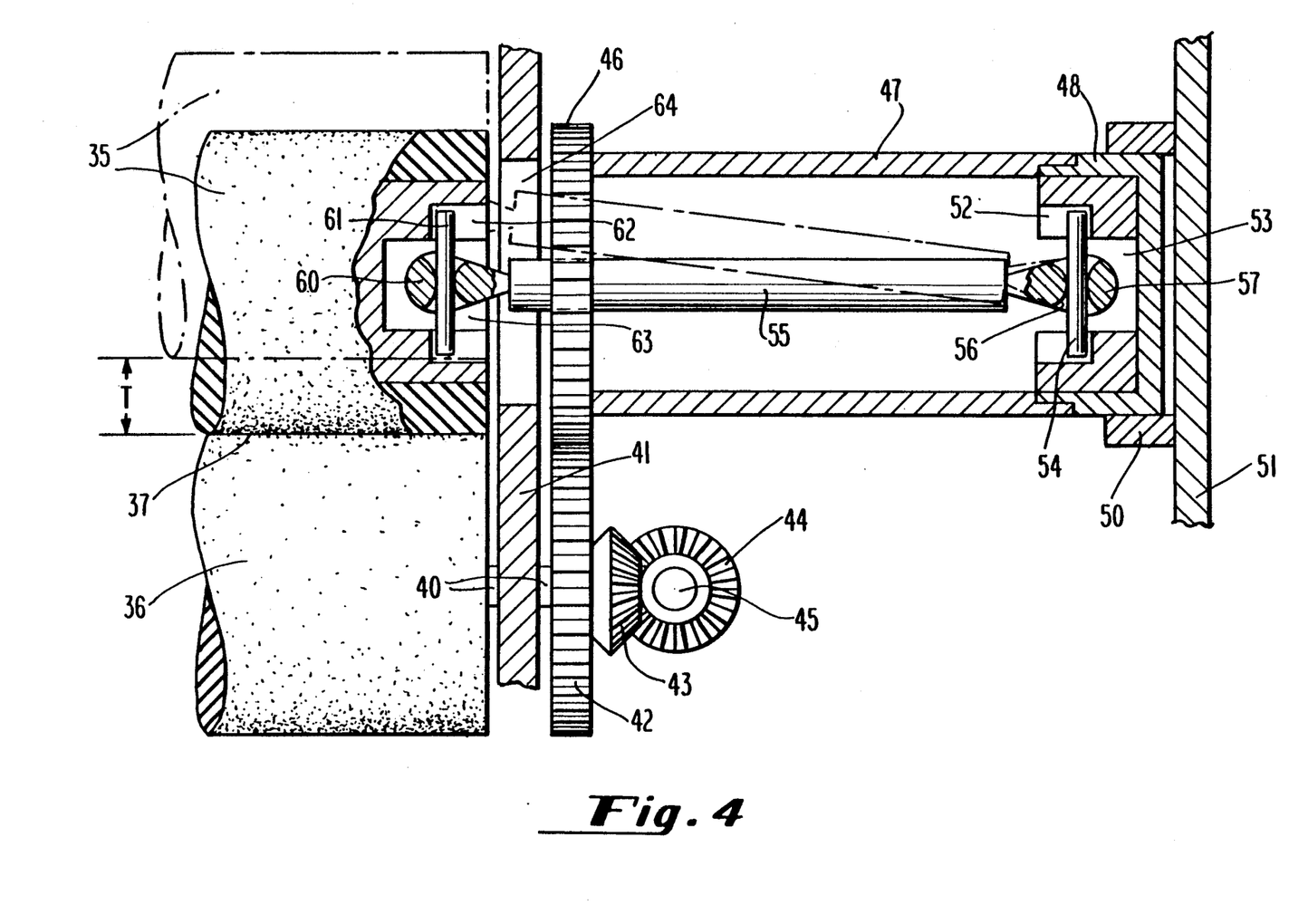
FIG. 4 is an enlarged fragmentary transverse sectional view of a pair of upper and lower roller members and the mechanism for driving the upper roller member as it is lifted to separate the nip, taken generally along the line IV—IV of FIG. 2.

With particular reference now to FIG. 4, in detail, it will be seen that the upper roller member 35 and lower roller member 36 are shown together, forming a nip at the location where they meet each other tangentially, at 37, but that upper roller member 35 is also illustrated in phantom, to show the manner in which it moves, vertically upwardly, an amount "T" as shown in FIG. 4, to accommodate the thickness of a thick article, such as, for example, the printed circuit board 40 or that 15, illustrated in FIGS. 3 and 2, respectively, passing through the nip 37 formed between upper and lower rollers 35 and 36.

It will be understood that either or both of the rollers 35 and 36 may be moved away from the other, to increase the space "T", but that, in most instances use will be made of gravity to return a moved roller to its original position and close the nip. Thus, in most instances, it will be the upper roller 35 that is moved upwardly by the thick article, allowing it to return via gravity to its original position. Accordingly, hereinafter, when reference is made to the nip being opened by raising the upper roller, it will be understood that the movement could occur by means of the lower roller moving downwardly, against a biasing or otherwise upwardly-urging force, as desired, or in the alternative, both rollers could move to open the nip.

The roller 36 is mounted for rotation with a shaft 40, through a side rail 41 through which the shaft 40 projects, with a spur gear 42 being carried thereon. Rightwardly or outwardly of the spur gear 42, is a bevel gear 43 that is driven by means of another bevel gear 44 that, in turn is carried on the main drive shaft 45 that runs into the plane of the paper, and along the side of the apparatus, for driving all such roller members, article conveying disks, and the like, from a unitary drive motor (not shown).

Accordingly, rotation of the shaft 45 drives the gear 44, which drives gear 43 and attached gear 42. The gear 42, in turn, drives upper gear 46, also a spur gear. Attached to spur gear 46, and extending outwardly therefrom, but moveable for rotation therewith, is a cylindrical axial extension or sleeve 47. The sleeve 47 has a cap 48 closing an end thereof, for rotation with the sleeve 47. The end cap 48 is mounted at its our end in a journal 50, for rotation therein as the gear 46 turns. The journal 50 is carried by a front wall 51 of the apparatus.

The cylinder cap 48 is provided with a cross slot 52 therein, traversing a central hole 53. The slot 52 receives a transverse key or pin 54, which may be of the shear pin type, if desired, such that, upon rotation of the gear 46, sleeve 47, and end cap 48 (the latter being in sliding rotation within the journal 50), driving torque is provided to the key or pin 54 by virtue of its being captured within slot 52, enabling the pin 54 to provide driving torque through the connector link 55, due to an opening 56 through the right end 57 of the connector link 55, through which the pin 54 passes. A slot 62 likewise traverses a bore or hole 63 in the right-most end of the upper roller member 35, as shown in FIG. 4. It will be noted that each pin 54 and 61, is able to move is associated slots 52 or 62, to allow for a pivotal movement of the associated end of the connector link 55 in slot 52 or 62, as connector link 55 moves from the full line position therefor to the phantom position illustrated therefor in FIG. 4, as the upper roller 35 moves from its full line to phantom position likewise illustrated therefor in FIG. 4.

In this regard, it will be apparent that the connector link 55 passes through the spur gear 46, by means of a suitable enlarged opening therethrough (not shown), and also has freedom to move upwardly and downwardly through a slotted hole 64 in side rail 41, as shown Thus, as the roller member 35 is caused to move upwardly due to a thick article being treating raising the same upwardly, the positive driving rotation of the upper roller member remains effected because the drive and driven gears 42 and 46 respectively remain in meshed engagement, as shown without relative separation of their axes, and the positive transmission of torque to the upper roller member 35 is effected as aforesaid.

Figure 5:
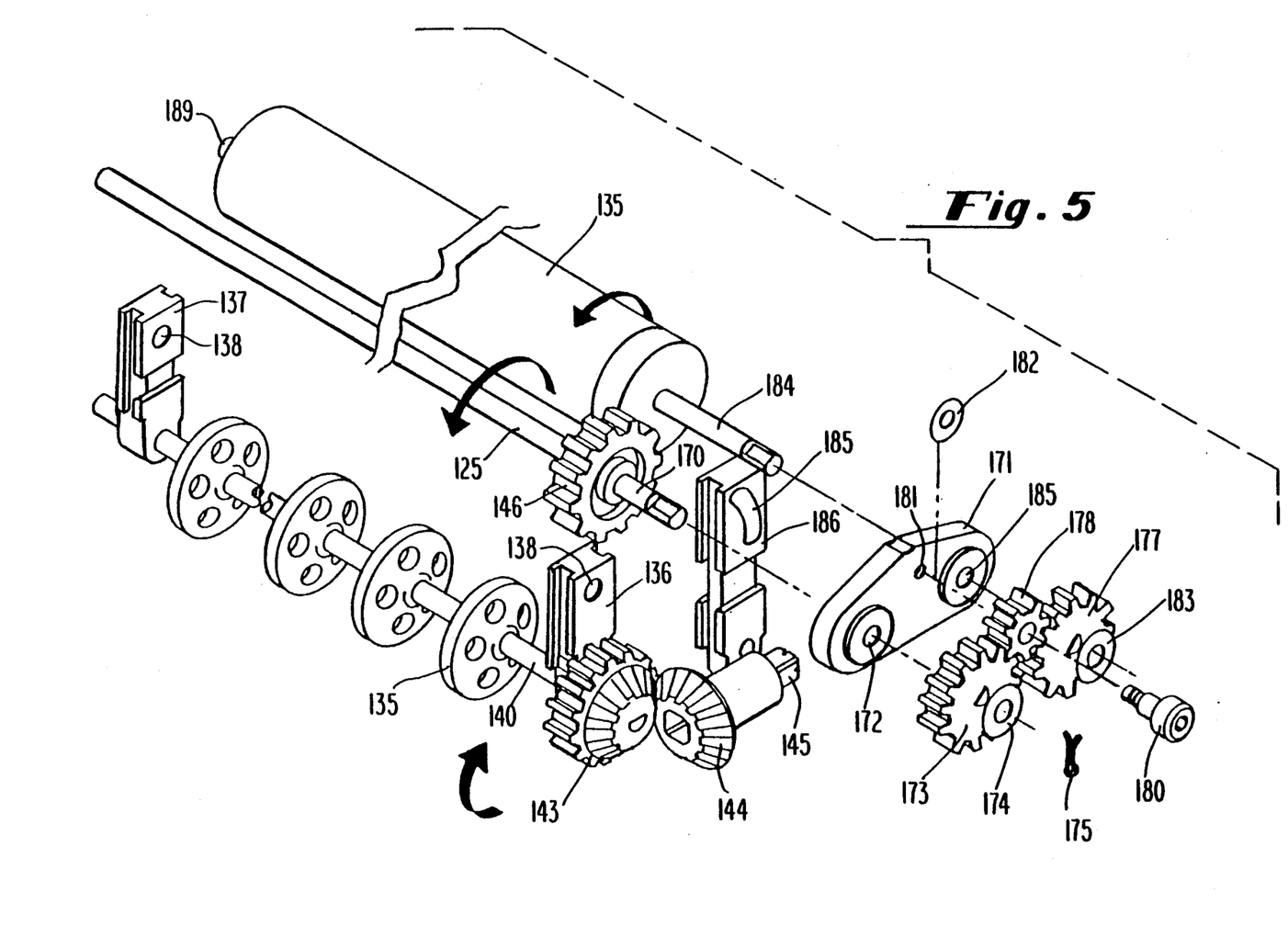
FIG. 5 is an exploded perspective view of an alternative drive for an upper roller member that represents a modified mechanism for driving the same as it is lifted.

With respect to the alternative drive arrangement for the upper roller illustrated in FIG. 5, it will be seen that, for purposes of clarity, many components are not shown. Thus, while an upper roller member 135 is shown, no comparable lower roller member forming a nip therewith is illustrated. A drive bevel gear 144, mounted on a main drive shaft or rod 145, provides driving torque along the side of the machine as discussed above, for driving a fixed bevel gear 143 therefrom. Gear 143 drives a lower drive shaft 140 that carries a plurality of rotationally driven drive disks 135 thereon, for comprising a portion of the path of travel of articles through the apparatus, for facilitating carrying the articles thereon. Mounted at opposite ends of the shaft 140 are a pair of side rail inserts 136, 137, carrying the shaft 140 therein for rotation therein, with the inserts 136, 137 being carried in a suitable side rails adjacent opposite sidewalls, such as that 23, of the apparatus of this invention. The side rail inserts 136, 137 will be made of a suitable plastic or other material that will allow sliding rotational movement of the shaft 140 therein. Holes 138 in the side rail inserts 136 and 137 also carry upper shaft 125 in rotatable sliding relation therein Shaft 125 has, carried outwardly of the insert 136, a spur gear 146 that meshes with spur gear portion of the gear 143. Outwardly of the gear 146, on shaft end 170 of shaft 125, is rotationally carried a connector link 171, through pivot hole 172. The outer end of shaft 170 carries a spur gear 173, with a suitable washer 174 and cotter key 175. The gear 173 transmits driving torque to spur gear 177 via an idler gear 178, with the gear 178 being mounted for rotation on a shoulder bolt 180 that is in threaded engagement in a tapped hole 181 in connector link 171 with the shoulder bolt 180 being provided with a washer 182 for facilitating turning of the gear 178 in a suitable sliding fashion on the outer surfaCe of the link 171. The gear 177 is provided with a suitable washer 183, and cotter key (not shown), and is mounted on the outer end of a shaft 184 that extends through a hole 185 in the link 171, with the shaft 184 carrying the upper roller member 135, as shown.

It will thus be apparent that as main drive shaft 145 turns, it causes the bevel gear 144 to turn the bevel portion of the gear 143, thereby driving the gear 146 and turning the shaft 170 in the counterclockwise direction shown. The shaft 170 turns the gear 173 in a like direction, which, in turn, acting through the idler 178, also turns the gear 177 in a counterclockwise direction, thereby turning the roller 135 in a counterclockwise direction. As a thick article causes the roller 135 to move upwardly opening the nip 42, roller shaft 184 is guided in an arcuate direction, by sliding along the arcuate slotted hole 185 in side rail insert 186, and a similar slotted hole in a side rail at opposite end 189 (not shown) thereby carrying the connector link 171 in arcuate movement about the shaft 170, such that the gear linkage provided via gears 173, 178, 177 remains in full meshed engagement without relative separation of their axes, as the roller member 135 moves upwardly in its arcuate, guided and controlled motion. It will thus be seen that in the embodiment of FIG. 5, the roller member 135 remains fully driven as the nip opens and closes, as aforesaid.

Figure 6:
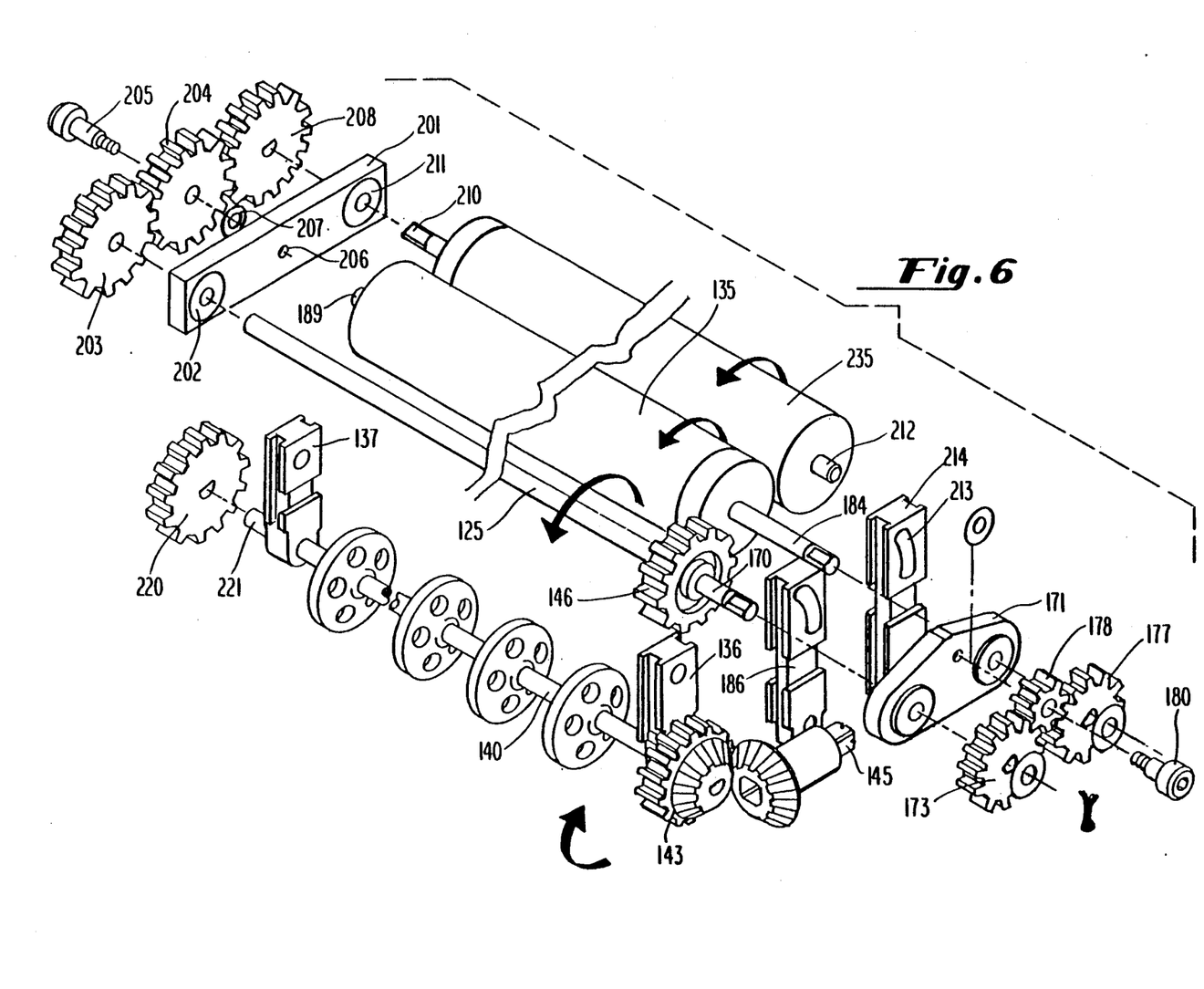
FIG. 6 is yet another alternative embodiment for driving a roller member as it moves away from and toward the nip, different than that of FIGS. 4 and 5, but more closely similar to that of FIG. 5, with means also being illustrated for driving yet another roller member adjacent and parallel to the one being driven in FIG. 5.

With reference to FIG. 6, another alternative arrangement is illustrated, similar to that of FIG. 5, but allowing additionally for the use of a second, parallel disposed upper roller member 235, to be raised and lowered along with member 135, without relative separation of their axes, while remaining driven from the main drive shaft 145. It will be understood that, in an arrangement such as that of FIG. 6, the roller 235 moves upwardly and downwardly to open and close a nip similar to that discussed above with respect to the roller 135. Also, in order to avoid unnecessary duplicate description herein, duplicate parts will not be described herein, but that parts as shown in FIG. 5 having counterparts in FIG. 6. will function as described above with respect to FIG. 5, and that only new components not shown in FIG. 5 will be described in detail for FIG. 6.

At the far end of the drive shaft 125, an additional connector link 201 is provided, having an opening 202 therein accommodating the shaft 125, to enable the link 201 to pivot thereabout at 202. At the outer end of the shaft 125, is provided a spur gear 203, fixedly mounted thereon for rotation with the shaft 125. The gear 203, in turn, drives an idler gear 204 mounted on an appropriate shoulder bolt 205, threaded into tapped hole 206, with the accommodation of suitable washers 207 or the like. The gear 204, in turn, drives spur gear 208 mounted on shaft 210 that extends through sliding bore or hole 211. The near end 212 of the shaft for roller member 235 is slideable in arcuate slotted hole 213 in side rail insert 214, for guiding the near end of the roller member 235 in its arcuate upward and downward motion, to open and close the nip. Similarly, a side rail insert (not shown) facilitates the guiding movement of the far end 189 of the shaft for roller member 135.

It will thus be seen that for those instances where an additional, adjacent, upper roller member 235 is to be rotatably driven while it is being raised and lowered through the nip, the drive gear 143 drives the drive gear 146, which, in turn, drives the gear 208 at the far end of the roller 235, via gears 203 and 204, while guiding the roller 234 in an arcuate motion dictated, in the first instance, by the pivotal connecting link 201, and, in the second instance, by the guide means 212, 213.

For additional torque to the gear train 203, 204, 208, for driving the roller member 235, another spur gear 220 may be provided on the far end 221 of the shaft 140, whereby the gear 220 will be in meshed engagement with the gear 203, for providing additional torque to the gear 203 over and above that provided to the gear 203 from shaft 125.

In view of the foregoing, it will be seen that several mechanisms are provided for facilitating the opening and closing of the nip formed between a pair of roller members, all while positively driving the roller members to and from the opening and closing of the nip, in order to accommodate the treating of thicker articles, such as printed circuit boards or other articles, without sacrificing a continuous and positive drive for such roller members as the nip is opened and closed.

It will be apparent from the foregoing that various modifications may be made in the details of construction, as well as in the use and operation of the apparatus of this invention, all within the spirit and scope of the invention as defined in the appended claims.

What is claimed is:

1. A process for chemically treating generally flat thick articles in a chamber with a liquid treatment fluid, wherein the fluid is applied to articles being treated along a path of travel for the articles, the process including the steps of:

(a) providing a substantially closed chamber for treating articles therein;
(b) delivering articles along a path of travel through the chamber;
(c) applying a liquid treatment fluid to articles being delivered along their path of travel through the chamber;
(d) providing opposed rotating cylindrical surfaced roller members normally in engagement with each other to form a closed nip therebetween when articles are not passing through the nip;
(e) positively rotatably driving at least one of the roller members of the nip;
 (i) by providing a driven member having a first axis and being carried by the at least one roller member;
 (ii) by providing a drive member having a second axis; and by
 (iii) engaging the driven member with the drive member;
(f) engaging the articles in the nip between the opposed rotating roller members to keep treatment fluid that is being applied to articles in the chamber from passing beyond of the nip; and
(g) opening the nip by engaging the at least one of the roller members of the nip and transversely displacing the axis of the engaged roller member away from its opposed roller member by contacting the roller members with articles as the articles pass through the nip, while continuing to positively rotatably drive the at least one roller member in the same positive manner, and without separation of said axes of the drive and driven members.

2. The process of claim 1, wherein the chamber is provided with inlet and exit openings, wherein the articles are delivered along their path of travel between the inlet and the exit openings and wherein treatment fluid is kept from passing outwardly from the chamber through a given one of the openings while the article being treated is passing through the opening, by locating the opposed roller members so that their nip is adjacent the given one of the openings.

3. The process of any one of claims 1 and 2, wherein the one roller member is driven by a driven gear mounted in axial extension from the one roller member.

4. The process of any one of claims 1 and 2, wherein the one roller member is driven through a pivotally mounted axial extension from the one roller member.

5. The process of claim 3, wherein the driven gear is mounted for movement with the one roller member as the nip opens and wherein a drive gear is provided, fixedly mounted for driving the driven gear therefrom, including the step of maintaining the drive gear and the driven gear in full mesh engagement as the one roller member moves to open the nip.

6. The process of claim 5, including the step of guiding the one roller member in a controlled path, from at least one end thereof, as the nip opens and closes.

7. The process of claim 5, including the step of providing a second one roller member mounted for parallel movement with the original one roller member, and moving the second one roller member in parallel movement with the original one roller member while positively driving the second one roller member.

8. An apparatus for chemically treating generally flat thick articles in a chamber with a liquid treatment fluid, wherein the fluid is applied to articles being treated along a path of travel for the articles, the apparatus including:
- (a) means providing a substantially closed chamber for treating articles therein;
- (b) means for delivering articles along a path of travel through the chamber;
- (c) means for applying a liquid treatment fluid to articles being delivered along their path of travel through the chamber;
- (d) means providing opposed rotating cylindrical surfaced roller members normally in engagement with each other to form a closed nip therebetween when articles are not passing through the nip;
- (e) driving means positively rotatably driving at least one of the roller members of the nip;
  - (i) including means providing a driven member having a first axis and being carried by the at least one said roller member;
  - (ii) including means providing a drive member having a second axis; and
  - (iii) with the driven member being in engagement with the drive member;
- (f) the opposed rotating roller members being disposed to provide means for engaging the articles in the nip, to keep treatment fluid that is being applied to articles in the chamber from passing beyond the nip; and
- (g) the opposed roller members including means for opening the nip by engaging the at least one of the roller members of the nip with articles being treated and transversely displacing the axis of the engaged roller member away from its opposed roller member as the articles pass through the nip while said driving means continue to positively rotatably drive the at least one roller member in the same positive manner, and without separation of said axes of said drive and driven members.

9. The apparatus of claim 8, wherein the chamber is provided with inlet and exit openings, wherein the means delivering the articles delivers them along their path of travel between the inlet and exit openings, including means keeping treatment fluid from passing outwardly from the chamber through a given one of the openings while an article being treated is passing through the opening, and means locating the opposed roller members so that their nip is adjacent the given one of the openings.

10. The apparatus of any one of claims 8 and 9, wherein the one roller member is provided with a driven gear mounted endwise from the one roller member.

11. The apparatus of any one of claims 8 and 9, wherein the one roller member is provided with driving means comprising a pivotally mounted axial extension from the one roller member.

12. The apparatus of claim 10, wherein the driven gear is mounted for movement with the one roller member as the nip opens and wherein a drive gear is provided, fixedly mounted for driving the driven gear therefrom, including means maintaining the drive gear and the driven gear in gear train engagement as the one roller member moves to open the nip.

13. The apparatus of claim 12, including means for guiding the one roller member in a controlled path, from at least one end thereof, as the nip opens and closes.

14. The apparatus of claim 12, including a second one roller member mounted for parallel movement with the original one roller member, and means for moving the second one roller member in parallel movement with the original one roller member while positively driving the second one roller member.

15. The apparatus of claim 10, wherein the driven gear is fixedly mounted in meshed engagement with a fixedly mounted drive gear; with an axial extension on one side of said driven gear being provided extending away from the one roller member; with a flexible connection between an outer end of said axial extension remote from said one roller member and one end of a drive link; with the other end of said drive link being flexibly connected to an adjacent end of the one roller member on the opposite side of the driven gear from the side having the axial extension; whereby movement of the one roller member in a nip-opening direction causes the one roller member to remain driven from said drive gear through said driven gear, through said axial extension, through said drive link and through said flexible connections.

16. The apparatus claim 15, including means journalling the outer end of said axial extension for rotational support thereof.

17. The apparatus of claim 12, wherein the drive gear and the driven gear have intermediate power transmission means connecting them together, and including an associated connector link means having an end pivotally mounted at a fixed location for pivoting thereabout and another end mounting the said endwise driven gear of said one roller member for arcuate movement about the said one end of said connector link means.

18. The apparatus of claim 17, including means for guiding the one roller member in a controlled path, from at least one end thereof as the nip opens and closes, with said means for guiding comprising an axial shaft carried by said one roller member and an arcuate slot in receiving engagement with said axial shaft as said connector link means is pivotally moved.

19. The apparatus of claim 17, including a second one roller member mounted for parallel movement with the original one roller member, and means for moving the second one roller member in parallel movement with the original one roller member while positively driving the second one roller member, wherein the means for moving the second one roller member includes an additional driven gear and additional power transmission means connecting the additional driven gear and the drive gear together, and including additional connector link means, with said additional driven gear, said additional power transmission means and said additional connector link means all being located at an opposite axial end of the one roller member from the end having the said associated connector link means.

* * * * *

UNITED STATES PATENT OFFICE
CERTIFICATE OF CORRECTION

Patent No. 5,007,968          Dated  April 16, 1991

Inventor(s)  Frederick E. Coffman and Charles H. Pelton

It is certified that error appears in the above-identified patent and that said Letters Patent is hereby corrected as shown below:

In column 5, line 32, after the words "mounted at its" delete --our and insert therefore "outer".

Signed and Sealed this

Eleventh Day of August, 1992

Attest:

DOUGLAS B. COMER

Attesting Officer    Acting Commissioner of Patents and Trademarks